(12) United States Patent
Stone (10) Patent No.: US 10,101,845 B2
(45) Date of Patent: Oct. 16, 2018

(54) CAPACITIVE TOUCH DEVICE (71) Applicant: Novalia Ltd, Cambridge, Cambridgeshire (GB)

(72) Inventor: Kate Stone, Impington (GB)

(73) Assignee: Novalia Ltd., Cambridge (GB)

( * ) Notice: Subject to any disclaimer, the term of this patent is extended or adjusted under 35 U.S.C. 154(b) by 77 days.

(21) Appl. No.: 14/652,882

(22) PCT Filed: Nov. 29, 2013

(86) PCT No.: PCT/GB2013/053155
§ 371 (c)(1),
(2) Date: Jun. 17, 2015

(87) PCT Pub. No.: WO2014/096772
PCT Pub. Date: Jun. 26, 2014

(65) Prior Publication Data
US 2015/0324032 A1    Nov. 12, 2015

(30) Foreign Application Priority Data

Dec. 18, 2012 (GB) .................................. 1222846.6
Aug. 14, 2013 (GB) .................................. 1314534.7

(51) Int. Cl.
*G06F 3/044* (2006.01)
*G06F 3/041* (2006.01)
*H03K 17/96* (2006.01)

(52) U.S. Cl.
CPC ............ *G06F 3/0416* (2013.01); *G06F 3/044* (2013.01); *H03K 17/962* (2013.01); *G06F 2203/04103* (2013.01); *H03K 2217/96077* (2013.01); *H03K 2217/960755* (2013.01)

(58) Field of Classification Search
None
See application file for complete search history.

(56) References Cited

U.S. PATENT DOCUMENTS 3,921,167 A * 11/1975 Fox ........................ H03K 17/98
307/116
6,317,011 B1 * 11/2001 Barnett .................... H01P 1/047
333/24 C (Continued)

FOREIGN PATENT DOCUMENTS

CN     202353925 U    7/2012
DE     100 19 410 A1  10/2001

(Continued)

OTHER PUBLICATIONS

Zack Albus, NPL PCB-Based Capacitive Touch Sensing with MSP430, Texas Instrument, Oct. 2007.*

(Continued)

*Primary Examiner* — Patrick Edouard
*Assistant Examiner* — Peijie Shen
(74) *Attorney, Agent, or Firm* — Stroock & Stroock & Lavan LLP (57) ABSTRACT

A capacitive touch device is described. The device comprises a capacitive touch controller (19) which includes an input port (20) and a capacitive touch sensor (23). The input port is coupled to the capacitive touch sensor by a path (25) which includes at least one capacitive coupling (26).

28 Claims, 5 Drawing Sheets

(56) References Cited

U.S. PATENT DOCUMENTS

| | | | | |
|---|---|---|---|---|
| 2004/0124714 | A1* | 7/2004 | Caldwell | H03K 17/962 307/99 |
| 2005/0206603 | A1* | 9/2005 | Kawachi | G09G 3/20 345/98 |
| 2006/0159899 | A1* | 7/2006 | Edwards | H05K 1/16 428/209 |
| 2006/0185968 | A1 | 8/2006 | Dzioba | |
| 2006/0238385 | A1 | 10/2006 | Steenwyk et al. | |
| 2008/0036746 | A1 | 2/2008 | Klingholt | |
| 2010/0253538 | A1* | 10/2010 | Smith | G01D 4/002 340/870.02 |
| 2011/0212429 | A1* | 9/2011 | Stone | B42D 3/123 434/317 |
| 2011/0272260 | A1* | 11/2011 | Wallace | H03K 17/962 200/300 |
| 2011/0279946 | A1* | 11/2011 | Niitsu | H05K 1/0239 361/313 |
| 2012/0105356 | A1* | 5/2012 | Brosnan | G06F 3/044 345/174 |
| 2012/0170237 | A1* | 7/2012 | Canegallo | H01L 23/48 361/767 |
| 2012/0212241 | A1* | 8/2012 | Wallace | A63F 3/00643 324/686 |
| 2013/0043061 | A1* | 2/2013 | Huang | G06F 3/041 174/250 |
| 2013/0155630 | A1* | 6/2013 | Yilmaz | G06F 3/044 361/748 |
| 2013/0316321 | A1* | 11/2013 | Herz | G09B 5/06 434/317 |
| 2014/0144992 | A1* | 5/2014 | Diorio | G06K 7/10297 235/488 |
| 2015/0249059 | A1* | 9/2015 | Maijala | A61J 1/035 257/664 |
| 2016/0209441 | A1* | 7/2016 | Mazzeo | G01P 15/125 |

FOREIGN PATENT DOCUMENTS

| | | |
|---|---|---|
| DE | 20 2012 102989 U1 | 9/2012 |
| GB | 2 464 537 A | 4/2010 |
| GB | 2487579 A | 8/2012 |
| JP | 2008525678 A | 7/2008 |
| WO | 2004/077286 A1 | 9/2004 |
| WO | 2010/043911 A1 | 4/2010 |
| WO | 2011143260 A2 | 11/2011 |

OTHER PUBLICATIONS

PCT International Search Report and Written Opinion from PCT/GB2013/053155 dated Apr. 4, 2014.

Search Report from British Patent Application No. GB1222846.6 dated Jun. 28, 2013.

International Search Report for PCT/US2005/046667 (annexed to JP2008/525678).

* cited by examiner

CAPACITIVE TOUCH DEVICE

CROSS-REFERENCE TO RELATED APPLICATIONS

This application is a national stage application under 35 U.S.C. 371 based on and claiming the benefit of International Application Serial No. PCT/GB2013/053155, filed on Nov. 29, 2013, which claims the benefit of priority from United Kingdom Patent Application No. 1222846.6, filed on Dec. 18, 2012, and United Kingdom Patent Application No. 1314534.7, filed on Aug. 14, 2013, the entire contents of each of which are incorporated herein by reference.

FIELD OF THE INVENTION

The present invention relates to a capacitive touch device.

BACKGROUND

Electronic components are increasingly being incorporated into printed items, such as books, posters and greeting cards, to allow these items to become more interactive. In particular, capacitive touch sensors are being incorporated into items to allow a user to provide input and the item to respond. Examples of such items are described in GB 2 464 537 A and WO 2004 077286 A.

SUMMARY

According to a first aspect of the present invention there is provided a capacitive touch device. The capacitive touch device comprises a capacitive touch controller, which includes an input port, and a capacitive touch sensor. The input port is coupled to the capacitive touch sensor by a path which includes at least one (in-line or series) capacitive coupling.

This can help to facilitate fabrication of the capacitive touch device. Furthermore, a capacitive touch device having a more complex track routing arrangement may be formed.

The input port may also be an output port. The capacitive touch controller may take the form of a microcontroller, such as a mixed signal microcontroller which includes a plurality of general-purpose input/output ports.

The capacitive touch controller may include more than one input port, each port coupled (via a respective capacitive coupling or a respective set of capacitive couplings) to a respective capacitive touch sensor.

The capacitive touch device may comprise a module which includes the capacitive touch controller. The module may include a module substrate supporting a coupling region for forming the capacitive coupling, wherein the input port is coupled to the coupling region by an unbroken conductive path. The coupling region may be a section, for example, end of a conductive track. The coupling region may be dimensioned, e.g. enlarged, to provide a coupling region of suitable capacitance and/or to aid alignment with a corresponding coupling region and, thus, facilitate assembly or formation of the device.

The conductive path may include at least one conductive track which may comprise a metal track or conductive ink.

The module substrate may comprise first and second opposite faces and the capacitive touch controller may be supported on the first face. The coupling region may be supported on the first face. In this case, capacitive coupling may take place through the module substrate. Alternatively, capacitive coupling can be arranged not to take place through the module substrate, for example, because the module is placed face down (e.g. by presenting the coupling region to a corresponding coupling region) to form the capacitive coupling. The coupling region may be supported on the second face. In this case, capacitive coupling can be arranged not to take place through the module substrate, for example, because the module is placed face up (e.g. by presenting the coupling region to a corresponding coupling region) to form the capacitive coupling The capacitive touch device may comprise a sheet or substrate comprising dielectric material. The sheet or substrate may include first and second opposite faces. The conductive track may be supported on a first face of the sheet. The track may be provided with a coupling region for the capacitive coupling. The conductive track may comprise conductive ink and/or conductive foil. The sheet or substrate may comprise a fibre-based material, such as paper, card, cardboard or hardboard. The sheet or substrate may comprise a plastics material. The sheet or substrate may be shaped, for example, curved or moulded.

The sheet or substrate may support the capacitive touch sensor.

Another different sheet or substrate may support the capacitive touch sensor. Thus, an additional capacitive coupling may be used to couple the sheet (or substrate) and the other, different sheet. The sheet or substrate may include more than one capacitive touch sensor.

The capacitive touch sensor may comprise a conductive pad. The conductive pad may comprise conductive ink (for example a metal-based ink and/or carbon-based ink). The conductive pad may have an area of at least 1 $mm^2$, optionally at least 10 $mm^2$.

The capacitive coupling may include first and second coupling regions and at least one dielectric region between the first and second coupling regions. The at least one dielectric region may include glue and/or tape. The at least one dielectric region may include a non-conductive layer. The at least one dielectric region may include a non-conductive patterned layer or pad. The non-conductive layer may comprise non-conductive ink. The non-conductive layer may comprise a non-adhesive material, e.g. an ink which is not a glue. The at least one dielectric region may comprise a stack of non-conductive layer(s). The patterned layer or pads may be polygonal (in plan view), for example square or rectangular. The patterned layer or pads may be regularly polygonal, for example square. The patterned layer or pads may be circular or elliptical.

The at least one dielectric region may include one or more dielectric sheets. The dielectric sheet(s) may comprise a fibre-based material. The dielectric sheet may comprise a plastics material. The at least one dielectric region may include a module substrate which supports the capacitive touch controller. The at least one dielectric region may include a substrate comprising dielectric material. The substrate may support the capacitive touch sensor. The substrate may comprise a fibre-based material, such as paper, card, cardboard or hardboard. The substrate may comprise a plastics material. The substrate may comprise a laminate.

The path may include at least two capacitive couplings in series having an effective capacitance. For example, there may be two capacitive couplings.

The capacitive coupling may have an area (i.e. an area of overlap) having a value between 0.001 $mm^2$ and 100 $mm^2$, optionally between 0.01 $mm^2$ and 10 $mm^2$.

The capacitive coupling(s) may have a (an effective) capacitance having a value between 0.1 to 100 pF, optionally between 1 and 10 pF.

The capacitive touch controller may be configured to perform a resistor-based capacitive measurement.

According to a second aspect of the present invention there is provided a printed article which comprises the capacitive touch device.

The printed article may comprise a book, game, greeting card, poster, product packaging, promotional item (such as a triangle calendar-like item or beer mat) or point of sale display.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
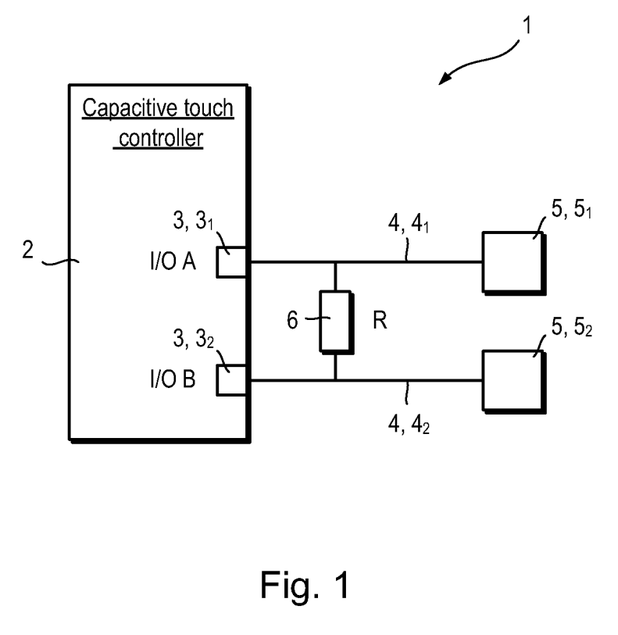
FIG. 1 is a schematic diagram of a capacitive touch sensing arrangement.

Referring to FIG. 1, a capacitive touch sensing arrangement 1 is shown which may be regarded as useful for understanding the invention.

The capacitive touch sensing arrangement 1 includes a capacitive touch controller 2 in the form of mixed-signal microcontroller, such as a Texas Instruments MSP 430, which includes first and second general-purpose input/output ports $3_1$, $3_2$ which are coupled by conductive lines $4_1$, $4_2$ to first and second capacitive touch sensors $5_1$, $5_2$. The first and second lines $4_1$, $4_2$ are connected by a resistor 6. The arrangement 1 can be used to sense touch using a resistor-based capacitive measurement as described, for example, in Zack Albus: "PCB-Based Capacitive Touch Sensing With MSP430", Texas Instruments Application Report, SLAA363A (2007) (http://www.ti.com/lit/an/slaa363a/slaa363a.pdf).

Figure 1A:
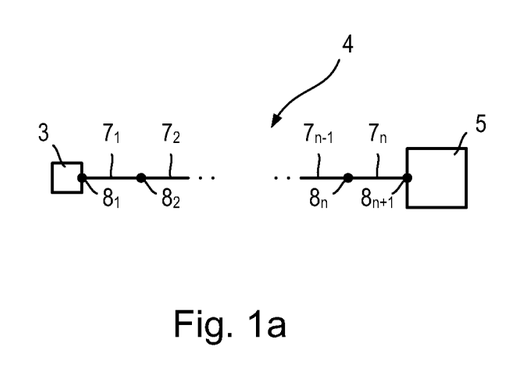
FIG. 1a is illustrates a conductive line coupling an input/output port and a capacitive touch sensor.

Referring also to FIG. 1a, each conductive line 4 provides a continuous conductive path (i.e. one that is unbroken) between a respective port 3 and a corresponding sensor 5. Each conductive line 4 consists of conductive sections $7_1$, $7_2$, . . . , $7_{n-1}$, $7_n$ joined by conductive connections $8_1$, $8_2$, . . . , $8_{n+1}$. A conductive section $7_1$, $7_2$, . . . , $7_n$ may take the form of, for example, a metal track on a printed circuit board (not shown), a wire, a piece of metal foil or a conductive ink track. Typically, a conductive line 4 includes at least two different types of conductive section. The conductive connections $8_1$, $8_2$, . . . , $8_{n+1}$ may take the form of, for example, a solder joint, a conductive glue joint, an abutting joint (that is, two conductors which are in contact but are not, for example, fused) or an integral joint (for example, between a track and a pad of conductive ink which provides a unitary structure).

The capacitive touch sensing arrangement 1 can be embedded in a book, game, greeting card or other printed item (not shown) to form an interactive printed item (not shown). However, the controller 2 and the touch sensor 5 can be disposed in different parts of the printed item (not shown), for example, on different substrates (for example, the controller is disposed on a printed circuit board and the touch sensors 5 are disposed on a piece of card), on different sides of a common substrate and/or on different parts of a common substrate separated by a crease or fold. Thus, it can be difficult to form continuous conductive lines 4. Therefore, a simpler, but less desirable, layout may be needed to allow the arrangement 1 to be embedded in the printed item (not shown). Additionally or alternatively, it may be necessary to rely on electrical wires and/or connector ribbons to provide paths which may make the interactive printed product more expensive and/or difficult to make.

The present invention is based, at least in part, on the insight that reliable capacitive touch sensing can still be achieved without a continuous conductive path between port and sensor.

Figure 2:
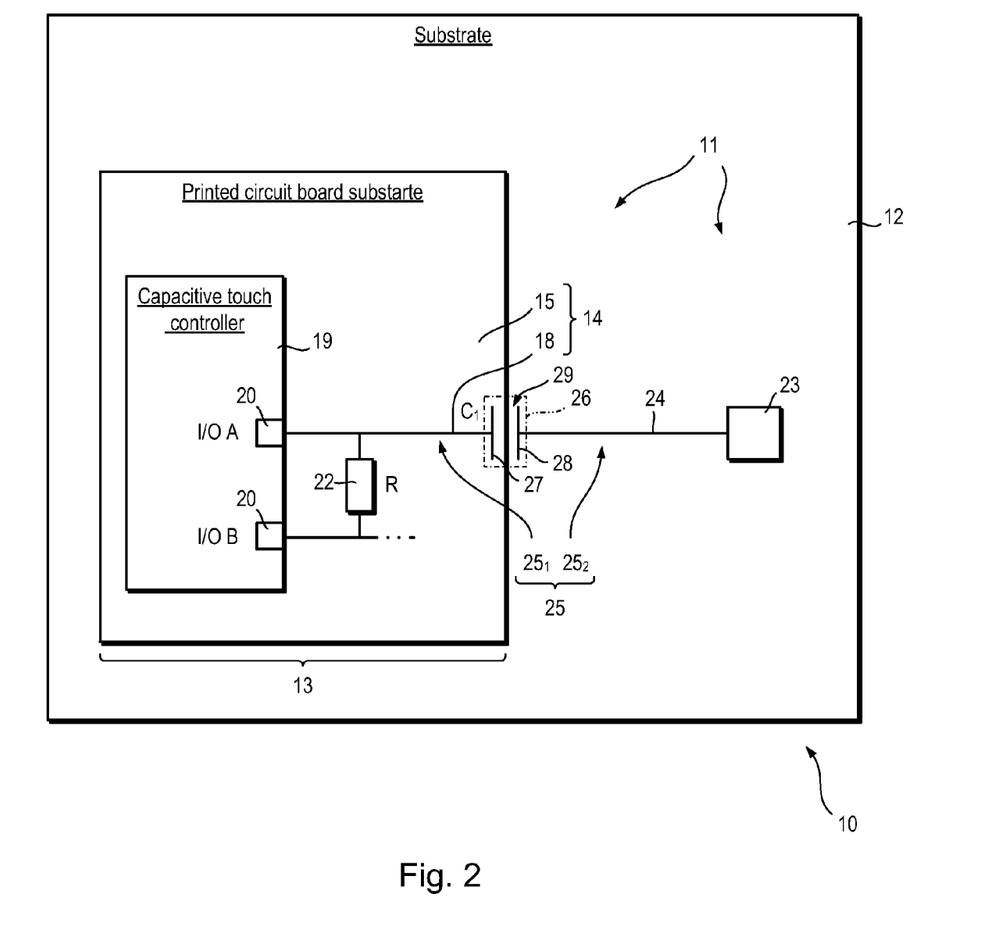
FIG. 2 is a schematic diagram of an article which includes a capacitive touch sensing arrangement in accordance with the present invention.

Referring to FIG. 2, an article 10, for example a printed item such as poster, greeting card or point of sale display, is shown which includes a capacitive touch sensing arrangement 11 in accordance with the present invention.

The article 10 includes a substrate 12, for example formed of paper, card or other fibre-based material, plastic or a laminate. The substrate 12 supports an electronic module 13.

Figure 2A:
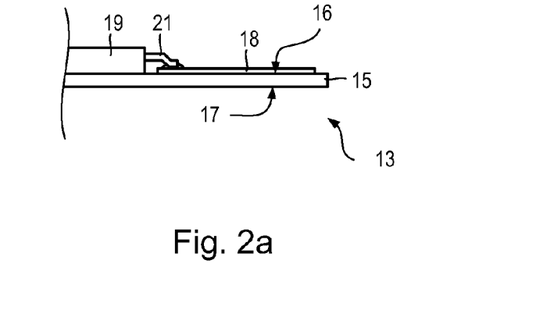
FIG. 2a is a side view of a portion of a module forming part of the article.

Referring also to FIG. 2a, the module 13 includes a printed circuit board 14 comprising a dielectric substrate 15 having front and back surfaces 16, 17 and a set of conductive tracks 18 supported on the front surface 16 and/or on the back surface 17. The module 13 includes a capacitive touch controller 19, such as a Texas Instruments MSP 430, which includes general-purpose input/output ports 20. The ports 20 are accessed by respective pins 21.

The printed circuit board 14 may be a traditional type comprising copper or metal tracks 18 formed on front and or back surfaces 16, 17 of a laminate substrate formed from, for example, cloth or paper and a thermoset resin. Solder (not shown) can be used to connect the conductive tracks 18 and pins 19.

However, printed circuit board 14 may comnprise conductive ink or foil track 18 formed on front and or back surfaces 16, 17 of a substrate formed from, for example, paper, card or other fibre-based material or plastic. Conductive ink or glue (not shown) can be used to connect the conductive tracks 18 and pins 19. If conductive ink is used, then screen, flexography, offset lithography or gravure printing can be used.

The capacitive touch controller 19 is used to sense touch using a resistor-based capacitive measurement. A timer (not shown) is clocked at a frequency of 8 MHz.

Figure 5:
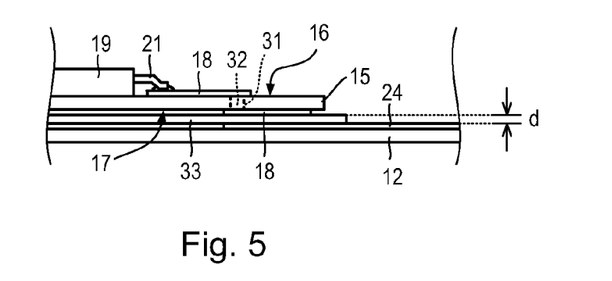
FIG. 5 is a longitudinal side view showing a module comprising a substrate having coupling regions provided on an underside of substrate.

Pairs of input/output ports 20 are connected by a resistor 22 having a value R. R may have a value which lies in the range between 500 kΩ and 5 MΩ. The resistor 22 effectively provides a resistor to ground when a port 20 is scanned (as shown in FIG. 5). Thus, for a sensor 23 which has a capacitance to ground of about 10 pF, then the discharge time of the sensor 23 is about 0.5 to about 50 µs.

The substrate 12 also supports at least one capacitive touch sensor 23 and at least one conductive track 24. Each touch sensor 23 is connected to a respective conductive track 24. In this case, the conductive track 24 comprises a single line. However, a conductive track may comprise more than one line and may include cross-linking lines.

The capacitive touch sensor(s) 23 and conductive track(s) 24 comprise conductive ink and may be formed by printing the conductive ink onto the substrate 12. Printing may comprise screen, flexography, offset lithography or gravure forms of printing.

As shown in FIG. 2, an input/output port 20 and a corresponding capacitive touch sensor 23 are coupled by a path 25. The path 25 includes first and second conductive sections $25_1$, $25_2$ provided mainly by a conductive track 18 (for example, formed of metal) and a conductive ink track 24 respectively. The resistance of the conductive ink 24 is $R_{track}$. If the conductive track 18 comprises metal, then the resistance of the track can be assumed to relatively small. However, if the conductive track 18 on the printed circuit board comprises conductive ink, then the conductive track 18 may have an appreciable resistance, $R_{track}$.

The first and conductive second sections $25_1$, $25_2$ are coupled by a capacitive coupling 26. Thus, the path 25 is broken and is not a single continuous electrical path. Expressed differently, the port 20 of the controller 19 and the sensor 23 are connected by a path 25 which is not ohmic.

Figure 3:
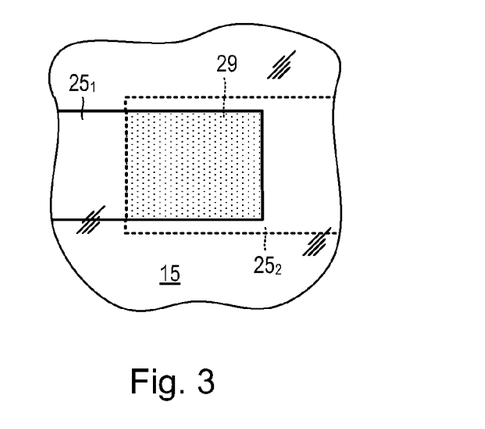
FIG. 3 is a plan view of a capacitive coupling.
Figure 4:
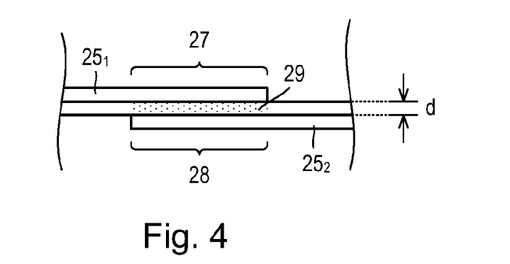
FIG. 4 is a longitudinal side view of the capacitive coupling shown in FIG. 3.

Referring to FIGS. 2, 3 and 4, the first and second conductive sections $25_1$, $25_2$ comprise respective first and second coupling regions 27, 28 which are separated by at least one dielectric layer or region 29 (shown shaded). The first and second coupling regions 27, 28 take the form of conductive pads or parts of tracks 18, 24 which overlap.

The first and second coupling regions 27, 28 have first and second areas $A_1$, $A_2$ respectively and are separated by a distance, d, of dielectric having a (or an average) relative dielectric constant $\varepsilon_r$. Typically, the first and second areas $A_1$, $A_2$ have values which lie in a range between about 0.001 mm² to about 100 mm², for example, around 0.1 mm² to about 10 mm². The first and second areas $A_1$, $A_2$ may have the same value, i.e. $A_1=A_2=A$. In any case, the effective area of the capacitive coupling is limited by the area of overlap. The distance, d, may have a value which lies in a range between about 1 µm to about 1 mm. The relative dielectric constant $\varepsilon_r$ lies in the range between about 2 and 10. As will be explained in more detail, combinations of values of first and/or second areas $A_1$, $A_2$, distance, d, and relative dielectric constant $\varepsilon_r$ can be found by experiment.

In this example, the at least one dielectric layer 29 consists mainly of the printed circuit board substrate 15. However, this need not be the case.

For example, the module 13 may be placed "face down" on the substrate 12. The at least one dielectric layer 29 may include the substrate 12. In other words, the module 13 is mounted on one side (i.e. face) of the substrate 12 and the sensor 23 and tracks 24 may be formed on the other, opposite side of the substrate 12. The at least one dielectric layer 29 may include air, glue and/or adhesive tape. The at least one dielectric layer 29 may include a dielectric sheet (not shown). The at least one dielectric layer 29 may include electrically non-conductive ink (not shown). A dielectric layer 29 may take the form of a pad, e.g. a patterned layer.

In another example, the module 13 may still be placed "face up" on the substrate 12, but the at least one dielectric layer 29 is not provided by the printed circuit board substrate 15.

Referring to FIG. 5, the dielectric substrate 15 supports conductive tracks 18 on the back surface 17. The dielectric substrate 16 includes through holes 31 between the front and back surfaces 16, 17 and a conductive via 32, for example solder or conductive ink, passes through the hole 31 to connect the tracks 18 on front and back surfaces 16, 17.

A dielectric layer 33 separates the conductive track 18 on the back surface 17 from the conductive track 24 on the substrate 12. The dielectric layer 33 may be an adhesive, such as tape or glue. Alternatively, the dielectric layer 33 is not adhesive and additional adhesive material (e.g. glue) and/or an adhesive arrangement (e.g. adhesive tape applied over the module 13) can be used.

This arrangement means that the printed circuit board substrate 15 does not provide the at least one dielectric layer 29. This can help to reduce the thickness, d, of the dielectric material and/or allow materials having a value of relative dielectric constant $\varepsilon_r$ which is different from that of the printed circuit board substrate 15, e.g. having a value which is greater than or equal to 5 (i.e. $\varepsilon_r \geq 5$) or greater than or equal to 10 (i.e. $\varepsilon_r \geq 10$) to be used.

The capacitive touch controller 19 can be mounted directly or via a carrier (not shown) on the substrate 12, i.e. without being supported by printed circuit board. The capacitive touch controller 19 or carrier (not shown) supports first coupling regions 27 which capacitively couple with the second coupling regions 28 on the substrate 12. The capacitive touch controller 19 or carrier (not shown) may take the form of a surface mount package or chip carrier. The first coupling regions 27 may take the form of conductive pads on a surface (e.g. back surface) of the controller or carrier (not shown).

Figure 6:
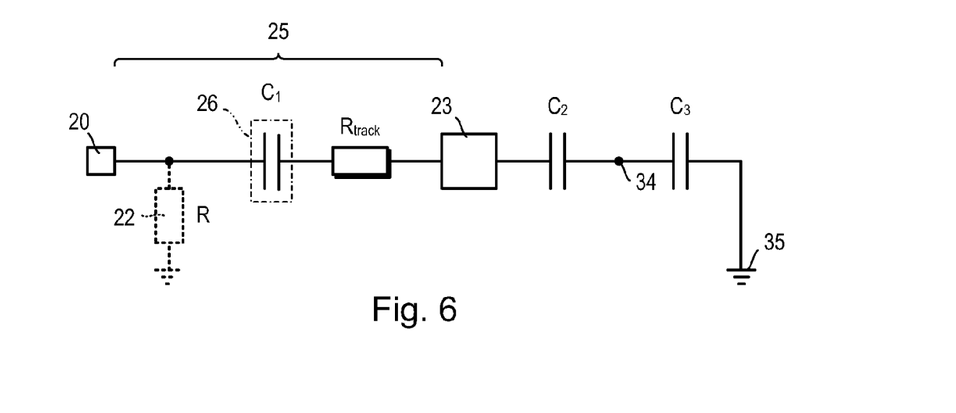
FIG. 6 is a schematic diagram of a circuit between a port of a capacitive sensing controller via a capacitive sensor and person to ground.

Referring also to FIG. 6, the capacitive coupling 26 has a capacitance, $C_1$. Thus, for a parallel plate arrangement, the capacitance of the capacitive coupling 26 is equal to about $\varepsilon_r \varepsilon_o A/D$ where $\varepsilon_o$ is the permittivity of free space, A is the area of overlap of the first and second coupling regions 27, 28 and d is the separation of the first and second coupling regions 27, 28. The capacitance between the sensor 23 and a person 34 when touching the sensor 23 is $C_2$. Typically, $C_2$ is about 1 to 10 pF, for example, around 3 pF. The capacitance between the person 34 and ground 35 is $C_3$. Typically, $C_3$ is about 100 pF.

$C_1$ may have a value which lies in a range of 0.1 pF to about 100 pF. The value of capacitance, $C_1$, can be found by experiment. Generally, however, the value of capacitance, $C_1$, is such that the capacitive touch controller 19 (FIG. 2) is able to detect that a person 34 has touched the sensor 23. For example, this may be achieved if an impedance, Z, between the sensor 23 and the person 30 (which comprises $C_2$) dominates. This can occur $C_1 < C_2$. For example, $C_1$ may be no more than half of $C_2$ or may be not more than a tenth of $C_2$.

Even though the capacitive touch controller port 20 and capacitive touch sensor 23 are connected by a path 25 which is not ohmic, effective capacitive sensing is still possible.

This can help facilitate assembly of the item 10 and/or affords greater design freedom. This is because the module 13 can be attached to the substrate 12 using non-conductive glue or tape or held (temporarily) against the substrate 12 using, for example, a clip or frame.

Figure 7:
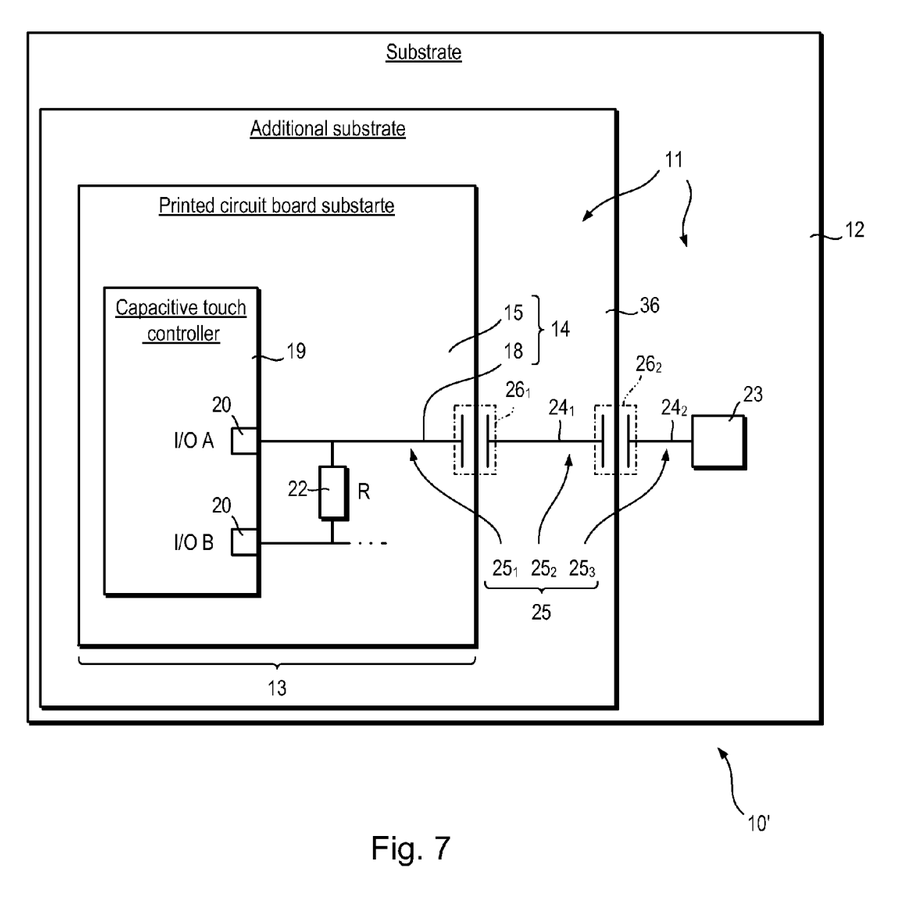
FIG. 7 is a schematic diagram of an article which includes another capacitive touch sensing arrangement in accordance with the present invention.
Figure 8:
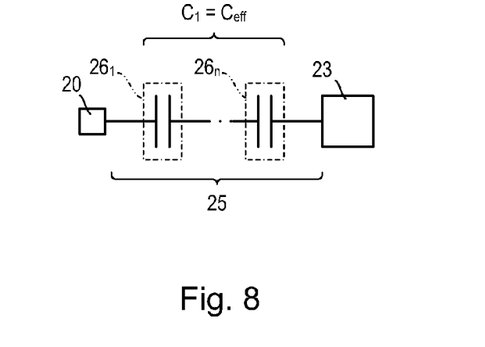
FIG. 8 illustrates multiple capacitive couplings between an input/output port and a capacitive touch sensor.

Referring to FIGS. 7 and 8, the path 25 may include more than one capacitive coupling $26_1, \ldots, 26_n$ having respective capacitances, $C_n, \ldots, C_m$. This can help facilitate routing of tracks around an item 10'. In FIG. 7, track resistances, $R_{track}, \ldots, R_{trackn}$, are not shown.

For example, a further intermediate substrate 36 may be placed between the substrate 12. The intermediate substrate 36 includes conductive tracks $24_1$ and can be used to link the module 13 and the sensor 23. The intermediate substrate 32 may itself include one or more sensors 23.

Thus, capacitive coupling can be used to route a path between a capacitive touch controller port 20 and a capacitive touch sensor 23.

Capacitances, $C_{11}, \ldots, C_{1n}$, of capacitive couplings $26_1, \ldots, 26_n$ which are arranged in series can be combined to provide an equivalent capacitance, $C_1$. Thus, values of capacitances, $C_{11}, \ldots, C_{1n}$, can be found by experiment to provide an equivalent capacitance $C_1$ having a value as hereinbefore described.

The item 10' may be book. A module 13 embedded, for example, in a cover and a sensor 23 on a page of the book may be connected through a single coupling through more than one page. Alternatively, capacitive coupling can be achieved between the module 13 and the page through a series of couplings.

The item 10' may be game which is formed by laminating several layers of card. Regions of the layers of card can be cut out and stacked to form cavities. A module 13 may be embedded within the game and sensors 23 may be disposed on a layer at or towards the top of the laminate. Like the book, the game may include a module 13 and the sensor 23 can be connected through a single coupling through more than one layer of card. Alternatively, capacitive coupling can be achieved between the module 13 and the sensor 23 through a series of couplings.

Figure 9:
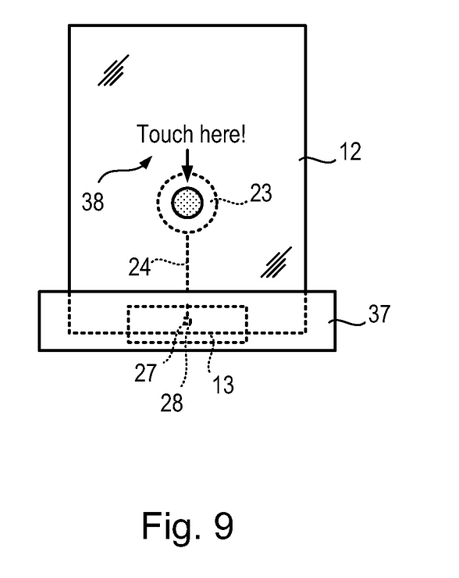
FIG. 9 is a schematic diagram of a poster with a clip-on module.

Referring to FIG. 9, the item 10 may comprise two parts, such as a frame 37 providing a surround or edge which includes the module 13, and a sheet 12, such as a poster or card, which can be replaced with another, different sheet 12 and which includes one or more sensors 23 and tacks 24. In FIG. 9, the sensor 23 is on the reverse side which is not seen by the user. On the front side, images and text 38 are printed.

A clamping arrangement, for example a sprung clip, may be used to hold the sheet 12 between two jaws (not shown). One of the jaws (not shown) may support terminals 27 for coupling to corresponding terminals 28 on the sheet 12. The terminals 27, 28 do not need to be direct contact. Instead, a reliable, capacitively coupling may be formed between the terminals 27, 28.

It will be appreciated that many modifications may be made to the embodiments hereinbefore described.

For example, the tracks on the substrate need not be printed but may comprise, for example, foil tracks.

The substrate may be opaque or transparent.

Other forms of capacitive measurement can be used.

What is claimed is:

1. A capacitive, touch device comprising:
a capacitive touch controller including an input port;
a module which includes the capacitive touch controller; and
a capacitive touch sensor;
wherein the input port is coupled to the capacitive touch sensor by a path which includes at least one capacitive coupling, wherein the module includes a module substrate supporting a first coupling region for forming the capacitive coupling, wherein the input port is coupled to the first coupling region by an unbroken conductive path, wherein the module substrate comprises first and second opposite faces, wherein the capacitive touch controller is supported on the first face, and wherein the first coupling region is supported on the first face;
wherein the device further comprises;
an opaque sheet comprising dielectric material which supports the capacitive touch sensor, the sheet including a first face and a second, opposite face; and
a conductive track supported on the first face of the sheet, the track including a second coupling region for the capacitive coupling;
wherein the capacitive coupling includes at least one dielectric region between the first and second coupling regions.

2. A capacitive touch device according to claim 1, wherein the conductive path includes at least one conductive track.

3. A capacitive touch device according to claim 2, wherein the at least one conductive track comprises a metal track.

4. A capacitive touch device according to claim 2, wherein the at least one conductive track comprises conductive ink.

5. A capacitive touch device according to claim 1, wherein the conductive track comprises conductive ink.

6. A capacitive touch device according to claim 1, wherein the conductive track comprises conductive foil.

7. A capacitive touch device according to claim 1, wherein the sheet comprises a fibre-based material.

8. A capacitive touch device according to claim 1, wherein the sheet comprises a plastics material.

9. A capacitive touch device according to claim 1, wherein the capacitive touch sensor comprises a conductive pad.

10. A capacitive touch device according to claim 9, wherein the conductive pad comprises conductive ink.

11. A capacitive touch device according to claim 9, wherein the conductive pad has an area of at least 1 $mm^2$.

12. A capacitive touch device according to claim 1, wherein the at least one dielectric region includes glue and/or tape.

13. A capacitive touch device according to claim 1, wherein the at least one dielectric region includes a dielectric sheet.

14. A capacitive touch device according to claim 13, wherein the dielectric sheet comprises a fibre-based material.

15. A capacitive touch device according to claim 13, wherein the dielectric sheet comprises a plastics material.

16. A capacitive touch device according to claim 1, wherein the at least one dielectric region includes a module substrate which supports the capacitive touch controller.

17. A capacitive touch device according to claim 1, wherein the at least one dielectric region includes a substrate comprising dielectric material.

18. A capacitive touch device according to claim 17, wherein the substrate supports the capacitive touch sensor.

19. A capacitive touch device according to claim 17, wherein the substrate comprises a fibre-based material.

20. A capacitive touch device according to claim 17, wherein the substrate comprises a plastics material.

21. A capacitive touch device according to claim 1, wherein the path which includes at least two capacitive couplings in series having an effective capacitance.

22. A capacitive touch device according to claim 1, wherein the capacitive coupling has an area having a value between 0.001 $mm^2$ and 100 $mm^2$, optionally between 0.01 $mm^2$ and 10 $mm^2$.

23. A capacitive touch device according to claim 1, wherein the capacitive coupling(s) has (have) a (an effective) capacitance having a value between 0.1 to 100 pF, optionally between 1 and 10 pF.

24. A capacitive touch device according to claim 1, wherein the capacitive touch controller is configured to perform a resistor-based capacitive measurement.

25. A printed article comprising a capacitive touch device according to claim 1.

26. A printed article according to claim 25, comprising a substrate which supports printed indicia.

27. A printed article according to claim 25, comprising a book, game, greeting card, poster, product packaging, promotional item or point of sale display.

28. A capacitive touch device according to claim 1, wherein the at least one dielectric region comprises non-conductive ink.

* * * * *